(12) United States Patent
Koeda et al.

(10) Patent No.: US 7,718,006 B2
(45) Date of Patent: May 18, 2010

(54) MASK HOLDING STRUCTURE, FILM FORMING METHOD, ELECTRO-OPTIC DEVICE MANUFACTURING METHOD, AND ELECTRONIC APPARATUS

(75) Inventors: Hiroshi Koeda, Suwa (JP); Shinichi Yotsuya, Chino (JP)

(73) Assignee: Seiko Epson Corporation (JP)

( * ) Notice: Subject to any disclaimer, the term of this patent is extended or adjusted under 35 U.S.C. 154(b) by 1027 days.

(21) Appl. No.: 11/417,319

(22) Filed: May 3, 2006

(65) Prior Publication Data

US 2006/0258030 A1 Nov. 16, 2006

(30) Foreign Application Priority Data

May 16, 2005 (JP) ............................. 2005-142189

(51) Int. Cl.
*C23C 16/00* (2006.01)

(52) U.S. Cl. ..................................................... 118/721

(58) Field of Classification Search ................. 118/720, 118/721; 156/345.3
See application file for complete search history.

(56) References Cited

U.S. PATENT DOCUMENTS

| 5,608,773 | A  | * | 3/1997 | Korenaga et al. ............. 378/34 |
| 6,875,542 | B2 |   | 4/2005 | Yotsuya |
| 6,878,209 | B2 | * | 4/2005 | Himeshima et al. ......... 118/720 |
| 2004/0142108 | A1 | | 7/2004 | Atobe et al. |

FOREIGN PATENT DOCUMENTS

| JP | 60-67363 | 5/1985 |
| JP | 2001-049422 | 2/2001 |
| JP | 2001-237073 | 8/2001 |
| JP | 2003-100460 | 4/2003 |
| JP | 2004-183044 | 7/2004 |

* cited by examiner

*Primary Examiner*—Parviz Hassanzadeh
*Assistant Examiner*—Maureen Gramaglia
(74) *Attorney, Agent, or Firm*—Harness, Dickey & Pierce, P.L.C.

(57) ABSTRACT

A mask includes a base plate having aperture parts, and chips having aperture patterns and positioned in the aperture parts of the base plate. The mask is arranged on a bottom surface of a bed plate with a substrate on which a film is to be formed sandwiched therebetween. Magnets are arranged on the bed plate, and plugs which are attracted to the magnets are arranged in the base plate.

8 Claims, 11 Drawing Sheets

(COMPARATIVE EXAMPLE)

MASK HOLDING STRUCTURE, FILM FORMING METHOD, ELECTRO-OPTIC DEVICE MANUFACTURING METHOD, AND ELECTRONIC APPARATUS

CROSS-REFERENCE TO RELATED APPLICATION

This application claims priority to Japanese Patent Application No. 2005-142189, filed May 16, 2005, the contents of which are incorporated herein by reference.

BACKGROUND

1. Technical Field

The present invention relates to a mask holding structure, a film forming method, an electro-optic device manufacturing method, and an electronic apparatus.

2. Related Art

An organic electroluminescence (EL) panel, which is a type of electro-optic device, has a self luminous display device having a laminated structure of thin films. A manufacturing process of an organic EL panel includes a film forming step in which a thin film pattern that constitutes construction layer of the display device is formed on a substrate.

As a method of forming a thin film pattern, an evaporation method that uses a metal mask (for example, see Japanese Unexamined Patent Application, First Publication No. 2001-237073) is known. In the evaporation method that uses a metal mask, it is difficult to manufacture a highly precise metal mask that corresponds to a large size substrate on which the film is to be formed. Moreover, since the thermal expansion coefficient of the metal mask is far greater than that of a glass substrate for an organic EL panel, pattern displacement occurs easily.

A method for manufacturing a mask using a silicon substrate which has a thermal expansion coefficient proximate to that of glass, has been proposed. In this method, an aperture pattern that corresponds to the film forming pattern is formed on a silicon substrate using semiconductor manufacturing techniques such as photolithography and dry etching.

In the mask manufacturing technique that uses the silicon substrate, the silicon substrate (silicon chip) on which the aperture pattern is formed, is attached to a supporting frame of the mask. However, in the case of corresponding to a large sized substrate on which a film is to be formed, distortion or deflection of a large sized supporting frame may cause a decrease in pattern precision.

SUMMARY

An advantage of some aspects of the invention is to provide a mask holding structure that corresponds to a large size substrate on which a film is to be formed, in which a mask has less distortion or deflection.

According to an aspect of the present invention, a mask holding structure that holds a mask having a base plate and chips, includes: a bed plate that has a bottom surface on which the mask is arranged with a substrate on which a film is to be formed sandwiched therebetween; a magnet arranged on the bed plate; and a plug which is arranged in the base plate, and which is attracted to the magnet.

In this mask holding structure, the mask is held on the bottom surface of the bed plate with the substrate on which the film is to be formed sandwiched therebetween, by magnetic attraction force between the magnet and the plug. By using magnetic attraction force, arbitrary positions of the mask, such as the center part of the mask, can be placed in close proximity to the bed plate. Distortion or deflection of a mask corresponding to a large size substrate on which a film is to be formed can be prevented.

Preferably a magnetic attraction force between the magnet and the plug is generated at a plurality of positions in the mask. In this construction, for a large substrate on which a film is to be formed, distortion or deflection of the mask can be reliably prevented.

Preferably the plug has a protrusion part facing the magnet. In this construction, the magnetic flux from the magnet can be easily guided to the plug, and the magnetic attraction force between the magnet and the plug is improved.

In one embodiment, the plug has a contacting surface that makes contact with a bottom surface of the base plate, and a protrusion part that projects from the contacting surface and is inserted into the base plate. In this embodiment, the magnetic attraction force acts on the base plate through the contacting surface of the plug. Accordingly, the base plate (mask) is pressed towards the bottom surface of the bed plate. The protrusion part of the plug has a function of readily guiding a magnetic flux from the magnet. The contacting surface of the plug has a function of transmitting the magnetic attraction force to the mask.

Preferably the protrusion part of the plug is arranged in a plurality of positions on the base plate. In this construction, the magnetic attraction force between the magnet and the plug is generated at a plurality of positions in the mask.

Preferably the magnet has a cylindrical shape that extends in a direction opposite to the plug. In this construction, a magnetic flux that is readily guided to the protrusion part of the plug by the cylindrical shaped magnet is formed, and the magnetic attraction force between the magnet and the plug is improved.

Preferably the plug has a protrusion part that faces the magnet, and has a diameter smaller than that of the magnet. In this construction, a magnetic flux from the magnet can be favorably guided to the plug, and the magnetic attraction force between the magnet and the plug is improved.

The construction may be such that the magnet is a rare-earth magnet. By using a rare-earth magnet (such as a samarium-cobalt magnet or a neodymium magnet) that can form a strong magnetic field, the size of the magnet and plug can be reduced.

The plug may be made from a soft magnetic material. By using a soft magnetic material (such as a permalloy or a silicon steel plate) that has a low coercive force, foreign substances that have magnetism can be prevented from attaching to the plug.

According to another aspect of the invention, there is provided a film forming method that uses the mask holding structure of the above aspect to form a thin film pattern on a substrate on which a film is to be formed. In this film forming method, a thin film pattern can be formed with a high level of precision, even on a large size substrate on which a film is to be formed.

According to yet another aspect of the invention, there is provided a manufacturing method for an electro-optic device that uses the film forming method of the above aspect to form a thin film pattern. In this manufacturing method, since a highly precise thin film pattern is formed, a high quality electro-optic device can be manufactured.

According to yet another aspect of the invention, there is provided an electronic apparatus which is provided with an electro-optic device manufactured by the manufacturing

DESCRIPTION OF EXEMPLARY EMBODIMENTS

Hereunder the present invention is described, with reference to the drawings.

Figure 1:
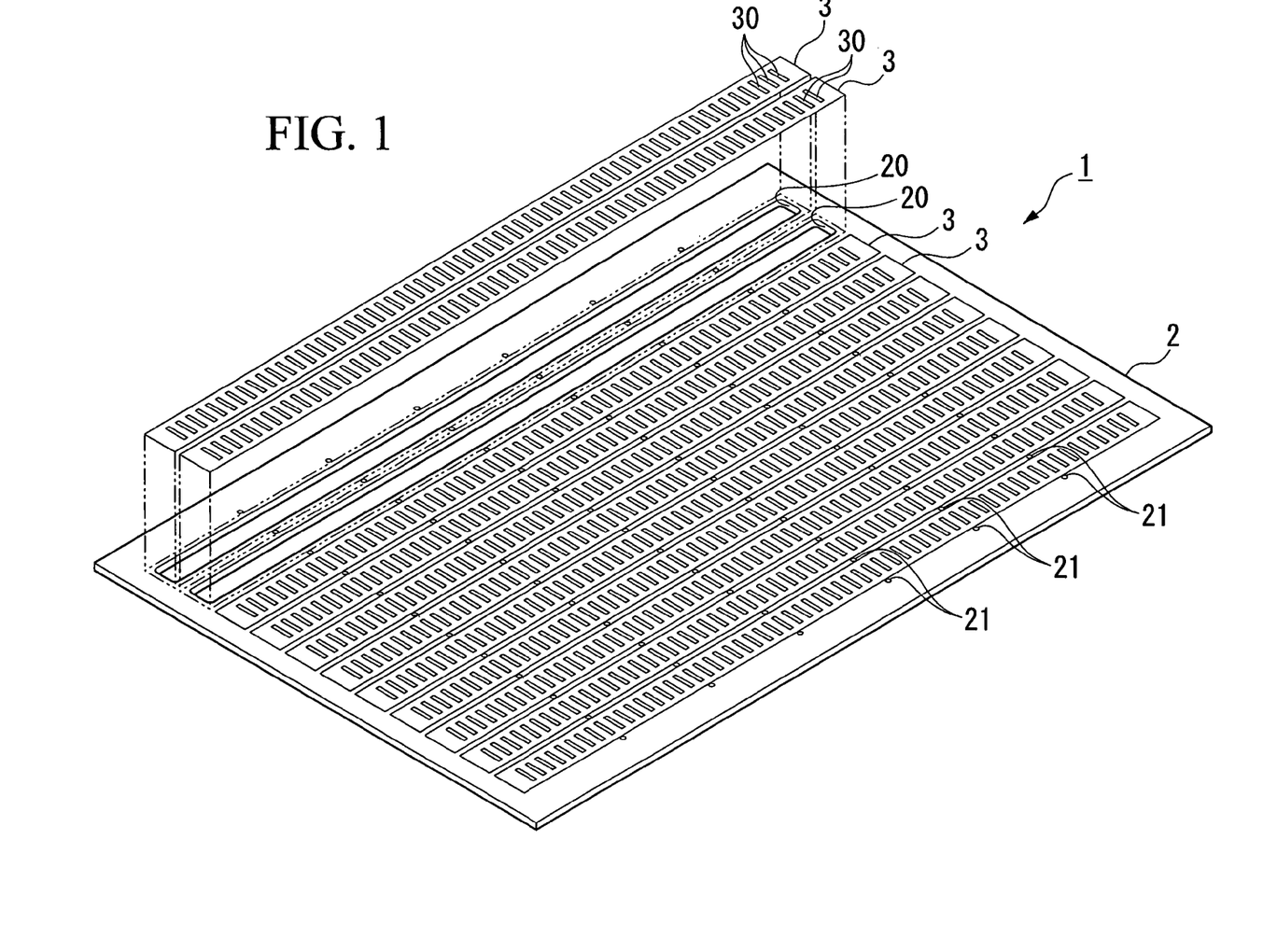
FIG. 1 is a perspective view showing a mask used in a mask holding structure.
Figure 2:
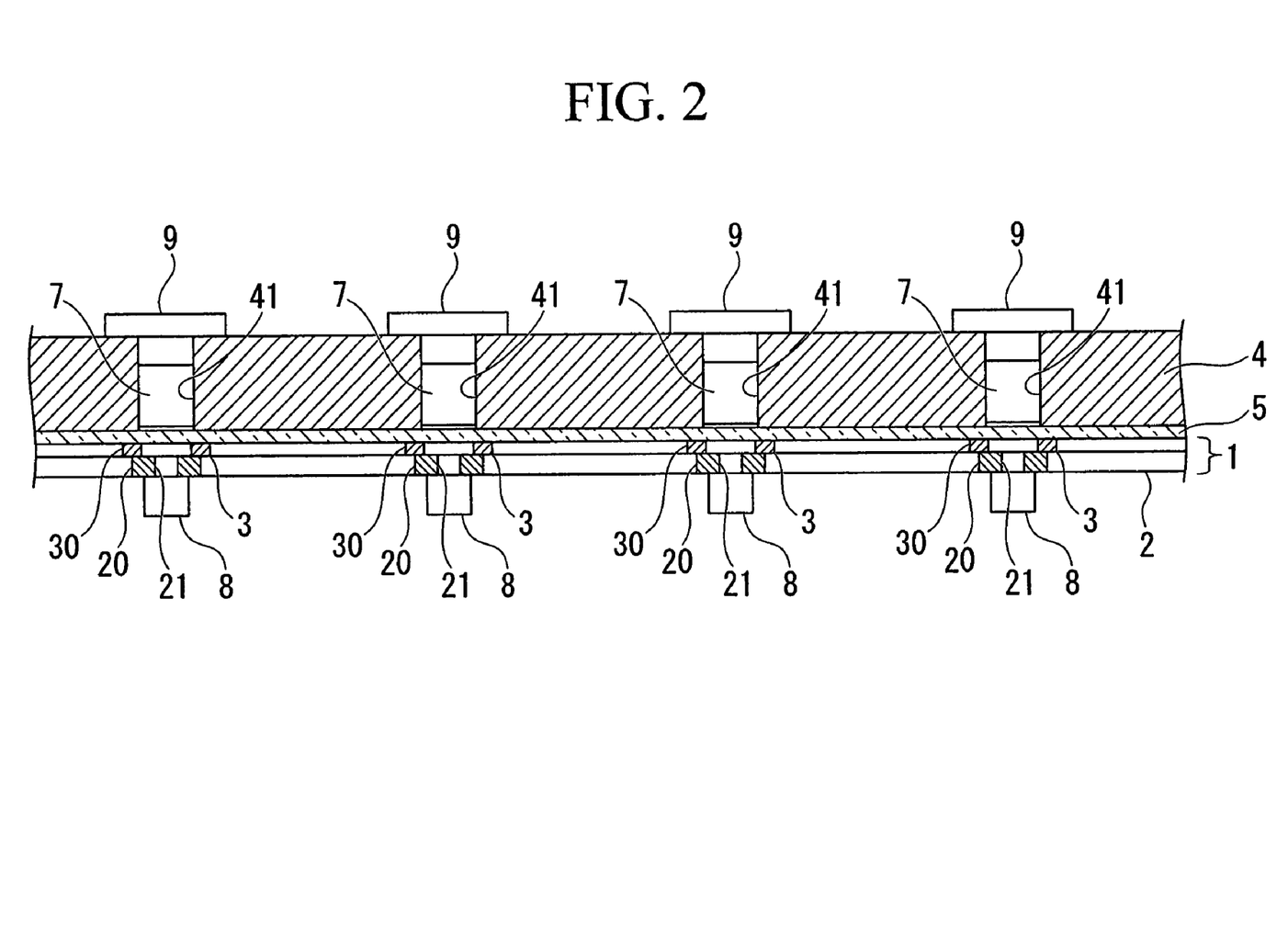
FIG. 2 is a partial sectional view showing the mask holding structure.
Figure 3:
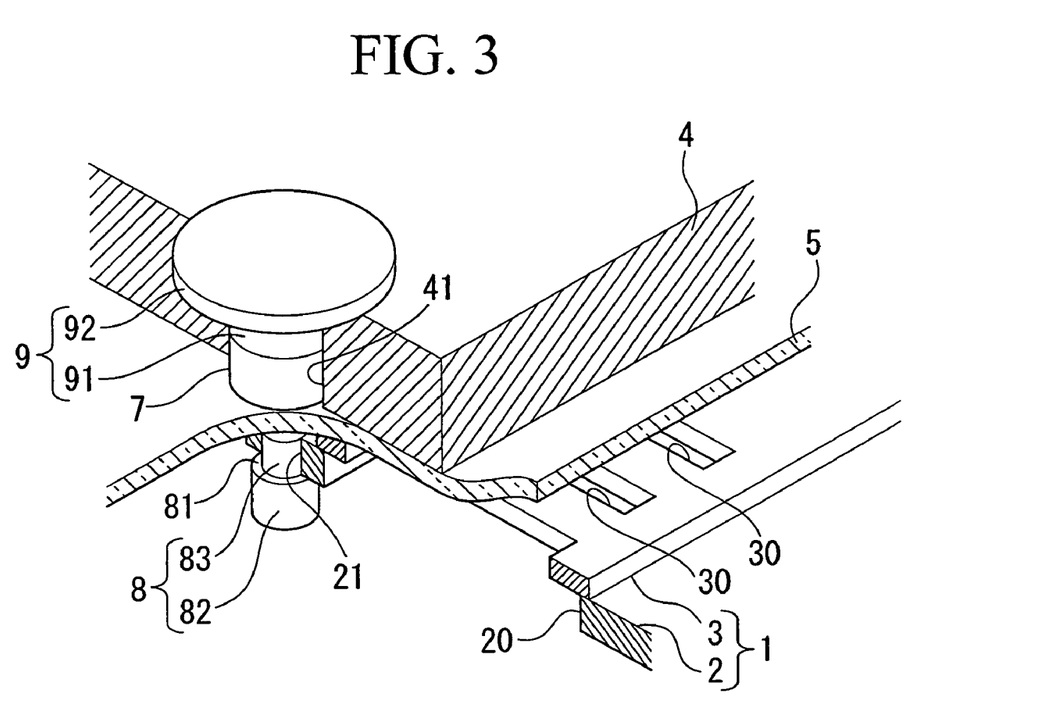
FIG. 3 is a partial perspective sectional view showing the mask holding structure.

FIG. 1 is a perspective view showing an a mask used in a mask holding structure, FIG. 2 is a partial sectional view showing the mask holding structure, and FIG. 3 is a partial perspective sectional view showing the mask holding structure.

First, a mask for vapor deposition that is used in the mask holding structure is described.

As shown in FIG. 1, a mask 1 has a construction where a base plate 2 on which aperture parts 20 are formed, and chips 3 on which aperture patterns 30 corresponding to film forming patterns are formed, are bonded to each other.

In the embodiment, a plurality of aperture parts 20 are formed in the base plate 2 in parallel rows, and the chips 3 are arranged respectively in the plurality of aperture parts 20. In FIG. 1, one chip 3 is arranged for one aperture part 20, however, the construction may be such that a plurality of the chips 3 is arranged for one aperture part 20.

More specifically, a plurality of the aperture parts 20 which are formed of a plurality of rectangular through holes, are provided in the base plate 2 at constant intervals and in parallel with each other. Aperture patterns 30 that have a plurality of slits lined up at constant intervals in the crosswise direction of the chip 3, are provided in the respective chips 3. The chips 3 are positioned in the aperture parts 20 of the base plate 2 with a high level of accuracy so that the aperture parts 20 of the base plate 2 are blocked, and the aperture patterns 30 are fitted inside the aperture parts 20 of the base plate 2.

In the embodiment, since the mask 1 has a construction in which the chips 3 having the aperture patterns 30, are attached to the base plate 2, then even in the case where a problem occurs in a chip 3, a repair can be easily performed by replacing the chip 3. Moreover, since the mask 1 has a construction where a plurality of the chips 3 is arranged on the base plate 2, then in the case where a problem occurs in a chip 3, the chip 3 in the part that has a problem (faulty, damaged, or the like) only need to be replaced. Also, in the mask 1, the chip 3 which is extremely small compared with the base plate 2, can be manufactured easily, and the mask 1 is preferably applied to a large sized substrate on which a film is to be formed (for example, a substrate greater than or equal to 20 inches in size).

For forming the base plate 2 and the chip 3, it is preferable to use materials that have a thermal expansion coefficient substantially equal to that of the substrate on which the film is to be formed (a later described deposition target substrate 5). In the embodiment, the substrate on which the film is to be formed is made of glass, the base plate 2 is made of glass, and the chip 3 is made of single crystal silicon. The thermal expansion coefficient of single crystal silicon is $30 \times 10^{-7}/°$ C. This is substantially equal to the thermal expansion coefficient of Pyrex glass (registered trademark) of Corning Co., Ltd., which is $30 \times 10^{-7}/°$ C. The thermal expansion coefficient of no-alkali glass OA-10 of Nippon Electric Glass Co., Ltd. is $38 \times 10^{-7}/°$ C. Moreover, as a material that has a thermal expansion coefficient substantially equal to that of glass, there is a metal material 42 alloy (thermal expansion coefficient: $50 \times 10^{-7}/°$ C.) and an invar material (thermal expansion coefficient: $12 \times 10^{-7}/°$ C.). Since the thermal expansion coefficients of the base plate 2 and the chip 3 are substantially the same as each other, distortion or deflection of the base plate 2 and the chip 3 due to a thermal expansion coefficient difference can be prevented. Since the base plate 2 and the chip 3 and the substrate on which the film is to be formed have substantially the same thermal expansion coefficients as each other, position displacement of the film forming pattern due to thermal expansion coefficient difference can be prevented.

The aperture pattern 30 of the chip 3 made of silicon can be formed by means of anisotropic etching. For example, since the chip 3 has a plane direction (110) or a plane direction (100), and the sidewall surface in a lengthwise direction of the respective slits of the aperture pattern 30 on the chip 3 has a plane direction (111), an aperture slit (aperture pattern 30) can be easily formed by means of crystal anisotropic etching.

The position of the chip 3 with respect to the base plate 2 is determined, for example, based on the observation result of alignment marks that have been respectively formed on the base plate 2 and the chip 3. By employing a photolithography technique or a blasting technique, the alignment marks can be formed on the base plate 2 made of glass. By employing a photolithography technique or crystal anisotropic etching, the alignment marks can be formed on the chip 3 made of silicon.

An adhesive agent, for example, is used for bonding the chip 3 to the base plate 2. As an adhesive agent, various kinds of publicly known adhesive agents can be applied. In the case where a water soluble adhesive agent (such as an acrylic adhesive agent) is used as an adhesive agent, the chip 3 can be easily removed from the base plate 2 by dissolving the adhesive agent of the chip 3 in which a problem has occurred. In the case where an adhesive tape having a UV detaching adhesive agent (for example, an agent containing urethane acrylate oligomer) applied to one side thereof and a UV non detaching adhesive agent (for example, acrylic copolymer agent) applied to the backside thereof is used, by illuminating UV onto the adhesive tape of the chip 3 in which a problem has occurred, the chip 3 can be easily removed from the base plate 2. In the case where a thermoplastic adhesive agent is used as an adhesive agent, by applying heat (for example, by irradiating a laser) to the adhesive agent of the chip 3 in which a problem has occurred, the chip 3 can be easily removed from the base plate 2.

Reference symbols 21 shown in FIG. 1 indicate plug holes into which are inserted plugs used for holding the mask 1 on the bed plate which serves as a supporting base therefor. A plurality of plug holes 21 which are distanced from each other, is provided in the area between the aperture parts 20 or in the vicinity area (non-aperture parts) of the aperture parts 20 on the base plate 2.

Next, an example of the mask holding structure of the present invention is described.

As shown in FIG. 2 and FIG. 3, the mask 1 is closely contacted and held on the bottom surface of a bed plate 4, with the deposition target substrate 5 sandwiched therebetween. That is to say, the deposition target substrate 5 is arranged on the bottom surface of the bed plate 4 so that the deposition target surface is facing downward. The mask 1 is arranged on the bottom surface (the deposition target surface) of the deposition target substrate 5, with the surface thereof on which the chips 3 are to be arranged facing upward. Magnets 7 are arranged on the bed plate 4, and plugs 8 that are magnetically attracted to the magnets 7 are arranged on the mask 1. The deposition target substrate 5 and the mask 1 are held on the bed plate 4 by the magnetic attraction force between the magnets 7 and the plugs 8.

Specifically, the mask 1 includes the base plate 2 having the aperture parts 20, and the chips 3 having the aperture patterns 30, which are positioned in the aperture parts 20 of the base plate 2. A plurality of plug holes 21 into which the plugs 8 are inserted is formed in the base plate 2.

A plurality of magnet holes 41 for arranging the magnets 7 in a position opposite the plug holes 21 is formed in the bed plate 4. Moreover, at least the bottom surface of the bed plate 4 (the surface on which the deposition target substrate 5 is arranged) has a high surface accuracy (for example, flatness 10 μm to 100 μm).

As shown in FIG. 3, the magnet 7 has a cylindrical shape. An engaging body 9 is attached to one end surface of the magnet 7. An adhesive agent, for example, is used for attaching the engaging body 9 to the magnet 7. The engaging body 9 has a column part 91 having a diameter the same as that of the magnet 7, and has an engaging part 92 having a diameter greater than that of the column part 91. The magnet 7 is attached to the end surface of the column part 91 of the engaging body 9.

The magnet 7 and the column part 91 of the engaging body 9 are inserted from above into the magnet holes 41 formed on the bed plate 4. By contacting the end surface of the engaging part 92 of the engaging body 9 with the top surface of the bed plate 4, the magnet 7 is positioned with respect to the bed plate 4. As a result of this positioning, the bottom surface of the magnet 7 is arranged on substantially the same surface, or slightly inside, with respect to the bottom surface of the bed plate 4. By holding the circumferential surface of the engaging part 92 of the engaging body 9, insertion and extraction of the magnet 7 in the magnet hole 41 in the bed plate 4 can be performed easily.

Various kinds of publicly known magnets can be applied as the magnet 7, and it is preferable to use a magnet that can form a strong magnetic field. As magnets that can form a strong magnetic field, there are rare-earth magnets such as a samarium-cobalt magnet and a neodymium magnet. Since neodymium magnets have a significant mechanical strength and are unlikely to become chipped, they are effective for controlling dust formation. By using a magnet that can form a strong magnetic field, the sizes of the magnet 7 and the plug 8 can be made small.

As shown in FIG. 3, the plug 8 has a base part 82 on which is formed a contacting surface 81 which makes contact with the bottom surface of the base plate 2, and a protrusion part 83 that is formed to project from the contacting surface 81 of the base part 82 and that is inserted into the base plate 2. The vertical section of the plug 8 has a symmetrical stepped shape. The protrusion part 83 has a cylindrical shape. The diameter of the protrusion part 83 (for example, a diameter of 3 mm) is smaller than the diameter of the magnet 7 (for example, diameter 10 mm).

The base part 82 of the plug 8 also has a cylindrical shape. The diameter of the base part 82 (for example, diameter 5 to 7 mm) is greater than the diameter of the protrusion part 83 and is smaller than the diameter of the magnet 7. The shape of the plug 8 is determined so that magnetic flux lines of the magnet 7 can be favorably guided to the plug 8 and furthermore so that the base part 82 of the plug 8 does not cast a shadow in vapor deposition.

The protrusion part 83 of the plug 8 is inserted from below into the plug hole 21 formed in the base plate 2 (mask 1). By having the end surface of the magnet 7 arranged in close proximity to the end surface of the plug 8 so that the plug 8 is positioned inside the magnetic field of the magnet 7, a magnetic attraction force occurs between the magnet 7 and the plug 8. This magnetic attraction force acts on the base plate 2 via the contacting surface 81 of the plug 8, so that the base plate 2 (mask 1) is pressed upward towards the bottom surface of the bed plate 4.

The material for forming the plug 8 need only be material that can be magnetically attracted to the magnet 7, and various kinds of publicly known material such as carbon steel that has been rustproof processed by means of Cr, Ni plating or the like can be applied. By using soft magnetic materials that have a small coercive force, such as permalloy and silicon steel plate, as a material for forming the plug 8, foreign substances that have magnetism are prevented from attaching to the plug 8. This is effective for the purpose of preventing damage to the mask 1 caused by dirt on the plug 8 or collision with foreign substances. Furthermore, by using martensite materials such as SUS410 and SUS404, corrosion of the plug 8 can be effectively prevented.

As described above, in the mask holding structure, the plugs 8 are arranged in a plurality of positions on the base plate 2, and the magnets 7 are also arranged accordingly in a plurality of positions on the bed plate 4. As a result, a magnetic attraction force between the magnets 7 and the plugs 8 occurs in a plurality of positions on the mask 1, and the mask 1 is held beneath the bottom surface of the bed plate 4, with the deposition target substrate 5 sandwiched therebetween.

Specifically, in the mask holding structure, since a magnetic attraction force between the magnet 7 and the plug 8 occurs in a plurality of positions on the mask 1, the entire mask 1, including the center and peripheral parts thereof, is pressed towards the bed plate 4 and is positioned in the vicinity of the bed plate 4 even if the magnetic attraction force in each position is comparatively small. As a result, bending or deflection of the mask 1 is prevented. In the mask holding structure, the number of positions where the magnets 7 and the plugs 8 are arranged is set (increased or decreased) according to the size of the deposition target substrate 5. The mask holding structure is preferably applied to a large size deposition target substrate 5.

Furthermore, in the mask holding structure, by making the shape of the plug 8 that is magnetically attracted to the magnet 7 to have the protrusion part 83 opposing the magnet 7, the magnetic flux from the magnet 7 is favorably guided to the plug 8, and the magnetic attraction force between the magnet 7 and the plug 8 can be improved.

Figure 4:
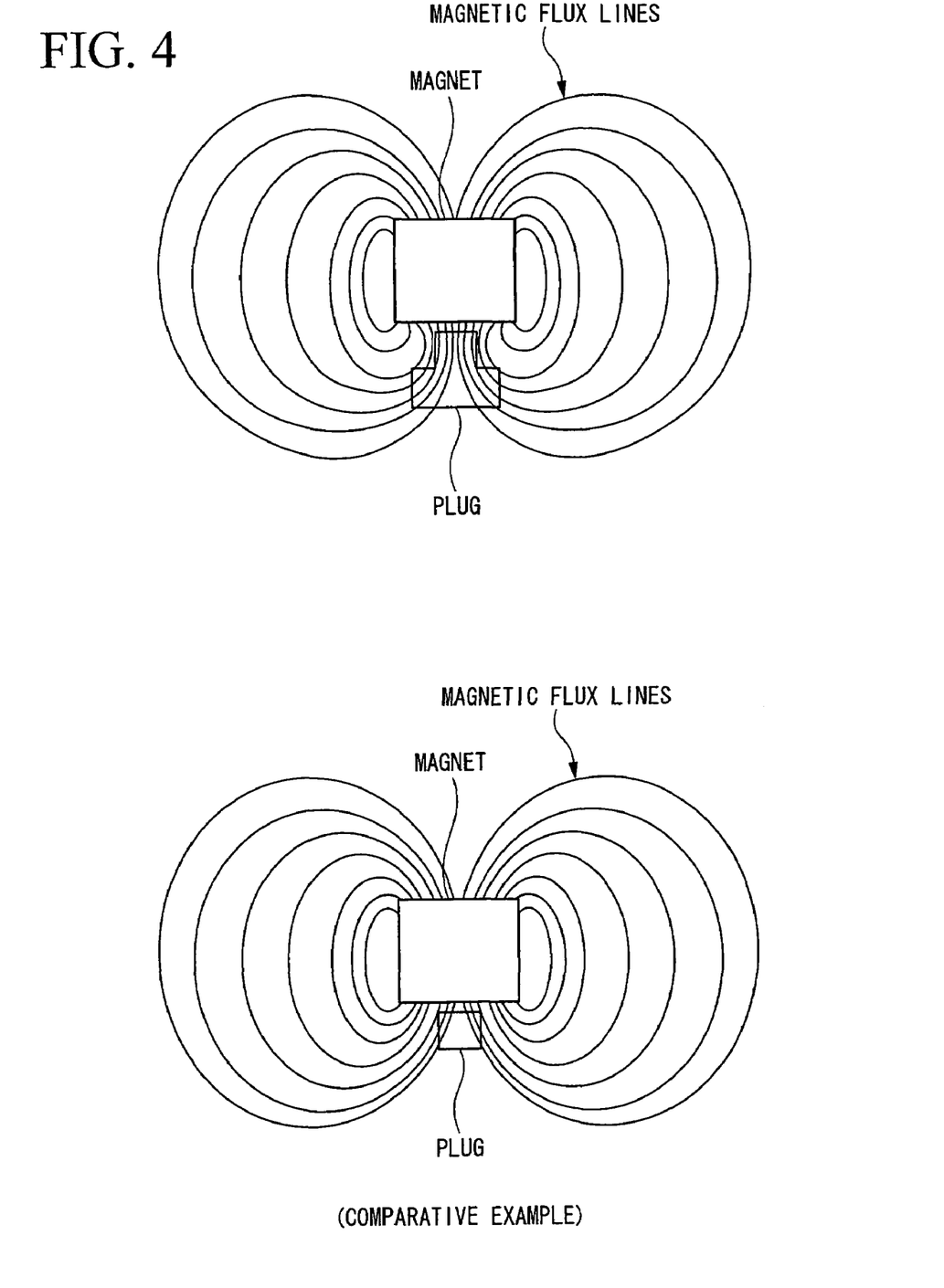
FIG. 4 is a diagram for comparing and describing changes in magnetic flux lines based on the shapes of plugs.

FIG. 4 is a diagram for comparing and describing the changes in magnetic flux lines based on the shapes of plugs.

As shown in FIG. 4, in a plug that does not have a protrusion part, less magnetic flux passes through the plug, and a major portion of the magnetic flux forms loops around the magnet that are unrelated to the plug. In order to increase the magnetic flux that passes through the plug, the entire plug needs to be enlarged. When the entire plug is enlarged, the plug hole in the mask (base plate) into which the plug is inserted, also needs to be enlarged accordingly. This has an adverse effect in terms of the pattern layout of the mask and the strength of the mask.

Compared to this, in the plug of this embodiment which has a protrusion part, the diameter of the plug becomes greater the further it is away from the magnet, just as the magnetic flux intervals also become greater the further they are away from the magnet. Therefore the magnetic flux from the magnet can be easily guided, and comparably more magnetic flux passes through the plug. In the plug of this embodiment, the magnetic attraction force between the magnet and the plug is significantly greater compared to that of a cylindrical shaped plug that has the same mass.

Figure 5:
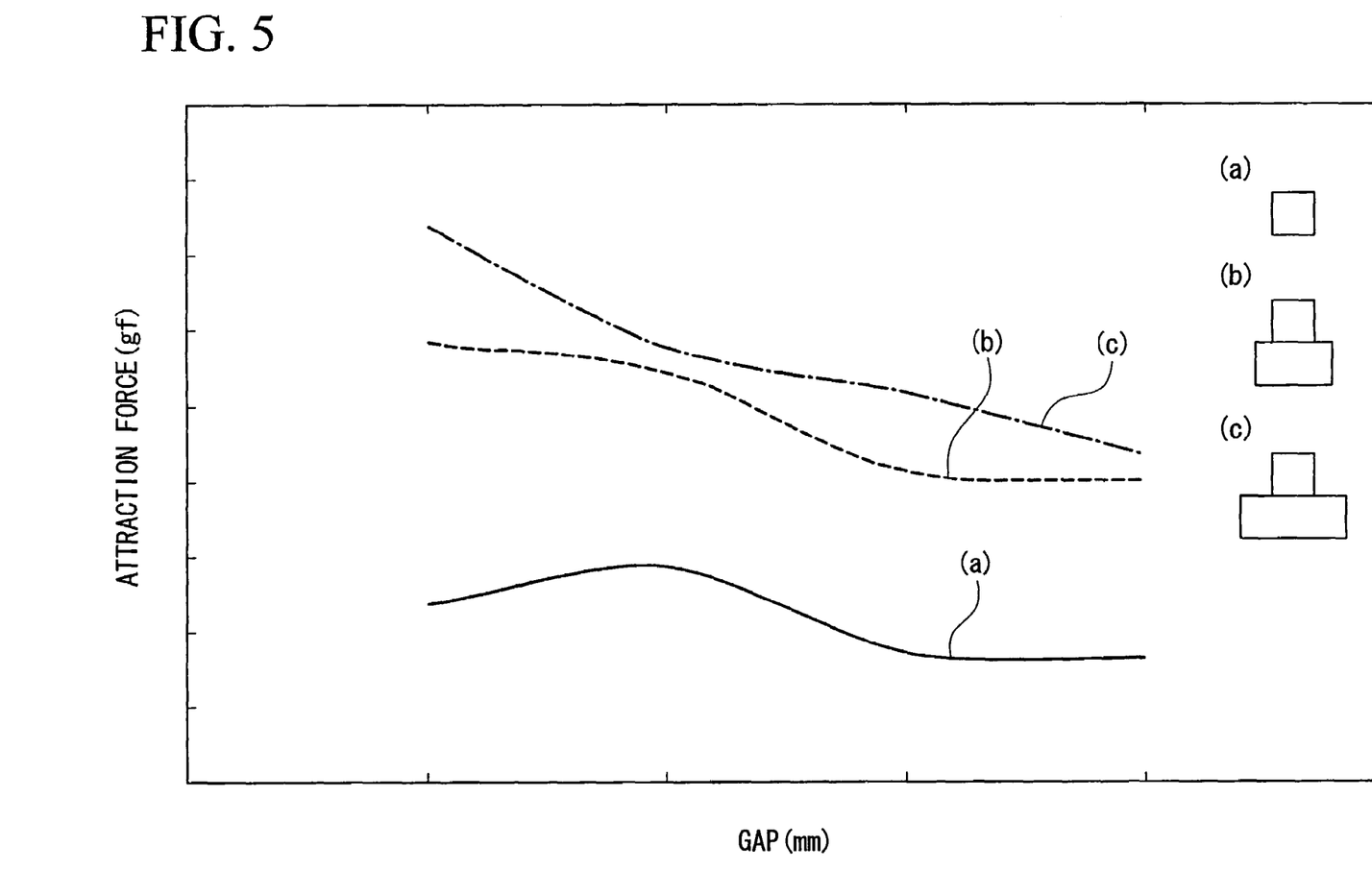
FIG. 5 is a graph showing the results of analyzing magnetic attraction force based on the shapes of plugs.

FIG. 5 is a graph showing the results of analyzing magnetic attraction force based on the shapes of plugs.

In FIG. 5, reference symbols (b) and (c) indicate plugs that have the protrusion parts, and (a) indicates a cylindrical shaped plug. The shape of the protrusion part of the plug (c) is the same as that of the plug (b), but the base part of the plug (c) is larger. As seen in FIG. 5, the magnetic attraction force of the plugs (b) and (c) that have the protrusion parts is greater than that of the cylindrical shaped plug (a). Upon measuring the magnetic attraction force of the plugs of the above respective shapes, the same results as for the analysis results are obtained.

Figure 6:
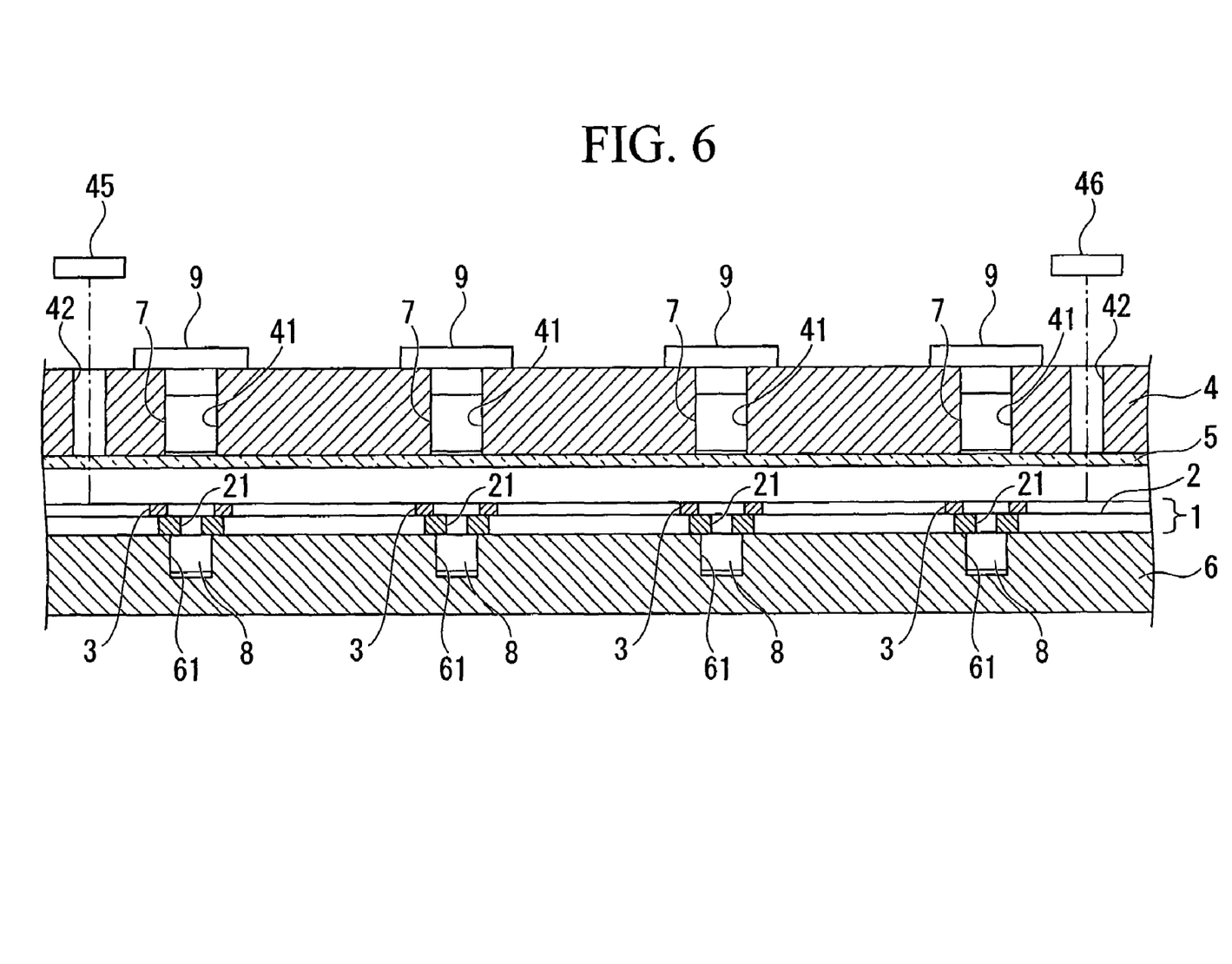
FIG. 6 is a diagram for describing the state of a mask set on a bed plate.

FIG. 6 is a diagram for describing the state where a mask 1 is set on a bed plate 4.

As shown in FIG. 6, first the deposition target substrate 5 is attracted to and held on the bed plate 4. This attraction and holding is carried out by means of vacuum attraction or electrostatic attraction. At this time, the position of the deposition target substrate 5 on the bed plate 4 is determined so that an alignment mark formed on the deposition target substrate 5 is positioned in the center of an observation hole 42 formed in the bed plate 4. After that, the magnets 7 are inserted from above into the magnet holes 41 formed in the bed plate 4. When inserting the magnets 7, the circumferential surface of the engaging body 9 that has been attached to the magnet 7 is held as necessary.

Next, the mask 1 is mounted on a mask mounting plate 6 for temporarily holding the mask 1. The mask 1 is attracted to and held on the mask mounting plate 6 by vacuum or static electricity. Prior to mounting the mask 1, the plugs 8 are arranged in plug groove holes 61 formed in the mask mounting plate 6. At this time, the plugs 8 are arranged so that the protrusion parts thereof face upward and the protrusion parts project from the top surface of the mask mounting plate 6. When mounting the mask 1, the mask 1 is positioned so that the protrusion parts of the plugs 8 are inserted into the plug holes 21 formed in the base plate 2.

Next, the bed plate 4 and the mask mounting plate 6 are gradually brought closer to each other. At this time, the alignment mark formed on the deposition target substrate 5 and the alignment mark formed on the mask 1 (base plate 2) are observed with an observation system 45 and 46 such as a CCD camera, and the mask 1 is positioned on the deposition target substrate 5 so that both of the alignment marks correspond with each other. When the deposition target substrate 5 and the mask 1 are in close proximity to each other or contact closely with each other, a magnetic attraction force acts between the magnet 7 and the plug 8.

When positioning the mask 1 on the deposition target substrate 5, even if the center of the magnet 7 is slightly displaced from the center of the plug 8, since the diameter of the protrusion part of the plug 8 is smaller than that of the magnet 7, the magnetic attraction force acts between the magnet 7 and the plug 8 in this position. In other words, the positioned state that has been determined using the alignment marks can be prevented from being disturbed due to magnetic influence.

Next, after the deposition target substrate 5 has contacted closely with the mask 1, the attraction force of the mask mounting plate 6 to the mask 1 is released, and the mask mounting plate 6 is relatively separated from the mask 1. The mask 1 is held on the bottom surface of the bed plate 4, with the deposition target substrate 5 sandwiched therebetween, by the magnetic attraction force between the magnet 7 and the plug 8. The attraction force of the bed plate 4 to the deposition target substrate 5 is released as necessary.

Next, the integrated body of the bed plate 4, the deposition target substrate 5, and the mask 1 is loaded into a vapor deposition chamber (not shown in the diagram). Vapor deposition inside the chamber is carried out by arranging a vapor deposition source under the deposition target substrate 5, and discharging particles from the source upwards. The particles from the source pass through the aperture pattern of the mask 1 and are injected onto the deposition target substrate 5. As a result, a film forming a pattern that corresponds to the aperture pattern of the mask 1 is formed on the deposition target substrate 5.

Figure 7:
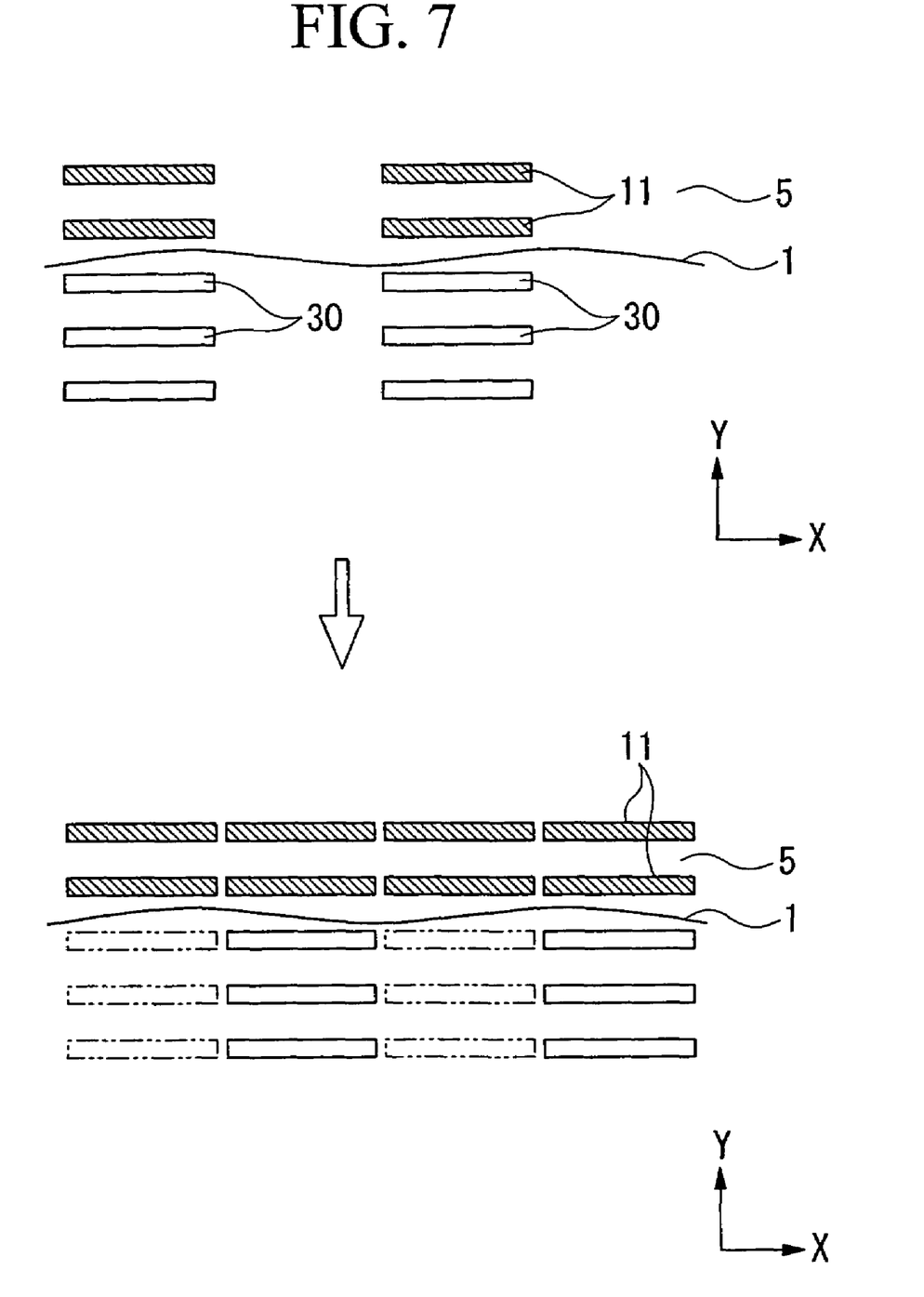
FIG. 7 is a diagram showing a pattern of the film formed by the mask in FIG. 1.

FIG. 7 shows a film pattern formed by the mask in FIG. 1.

As shown in FIG. 7, when the particles from the vapor deposition source have passed through the aperture pattern of the mask 1, a deposition pattern 11 having substantially the same shape as the aperture pattern 30, is formed over one surface of the deposition target substrate 5. The deposition pattern 11 formed by the mask 1 includes a plurality of lines (linear pattern lines) in which a plurality of linear patterns is lined up at equal intervals in a crosswise direction (Y direction) to the linear pattern. This plurality of linear pattern lines is arranged to be distanced from each other in the lengthwise direction (X direction) of the linear pattern at constant intervals.

In this embodiment, vapor deposition is carried out on the deposition target substrate 5, at least twice, using the same mask 1. That is to say, after vapor deposition of the deposition pattern 11 has been carried out for the first time onto the deposition target substrate 5, the relative position of the mask 1 with respect to the deposition target substrate 5 is displaced, and then a second vapor deposition of the deposition pattern 11 on the deposition target substrate 5 is carried out. At this time, the deposition pattern 11 of the second deposition is formed in the area between the plurality of linear patterns in the deposition pattern 11 formed in the first deposition. As a result, the deposition pattern 11 is formed all over the deposition target substrate 5. Moreover, as described later, in manufacturing an organic EL panel, the above film deposition is carried out twice for R, G and B respectively.

In the mask holding structure shown in FIG. 2, since the shape of the plug 8 is optimized, and a magnet 7 that can generate a strong magnetic field is used, the size of the plug 8 arranged in the mask 1 is small. Therefore, the area of the non-aperture part in the mask 1 can be made narrow. That is to say, in the mask holding structure, although the plug 8 for utilizing the magnetic attraction force is arranged in the mask 1, a reduction in opening ratio of the mask 1 due to this arrangement can be suppressed or avoided. For this reason, a highly efficient pattern layout can be used in the mask holding structure.

In the mask holding structure, the magnets 7 are arranged in the bed plate 4 on the deposition target substrate 5 side, and the plugs 8 are arranged in the mask 1. This is because if the magnets are arranged in the mask 1, there is a possibility that the mask 1 may be damaged by an object that is magnetically attracted to the magnets.

Moreover, the method for replacing the chip 3 on the base plate 2 of the mask 1 is not limited to the above method. For example, the corner part of the chip 3 attached to the base plate 2 may be made removable by separating it by breaking or cutting, and a new chip having a shape with which the remaining pieces do not interfere may be attached to the base plate 2.

Moreover, the case where the mask holding structure of the present invention is used for an evaporation method is described, however, the present invention is not limited to this. The mask holding structure of the present invention can also be applied to other film forming methods such as a sputtering method and a CVD method.

Furthermore, the shapes and numbers of the respective components such as the mask 1, the magnet 7 and the plug 8 can be appropriately changed, and they are not limited to the above description.

FIGS. 8A to 8D are diagrams showing modified embodiments of the plug 8.

Figure 8A:
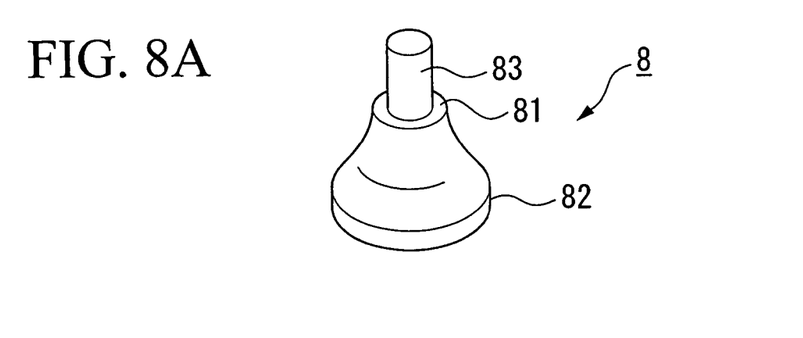
FIGS. 8A, 8B, 8C, and 8D are diagrams showing modified embodiments of plugs.

In the plug 8 in FIG. 8A, the diameter of the base part 82 becomes greater towards the axial outward direction, compared to the embodiment in FIG. 3. The shape of the base part 82 of FIG. 8A is determined so that for example the magnetic flux from the magnet can be further guided by the inside of the base part 82.

Figure 8B:
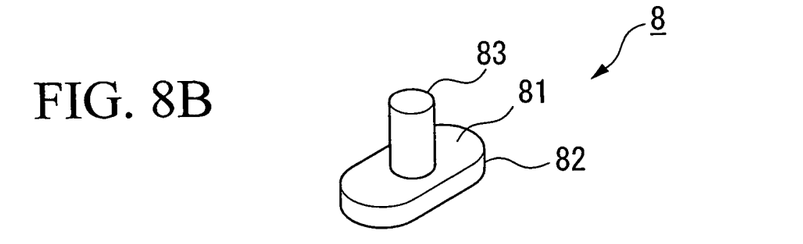

In the plug 8 in FIG. 8B, the planar shape of the base part 82 is formed in an elliptical shape (it may also be formed in an oval or rectangular shape). By enlarging the base part 82 in at least a possible direction, more magnetic flux from the magnet can pass through the plug 8.

Figure 8C:
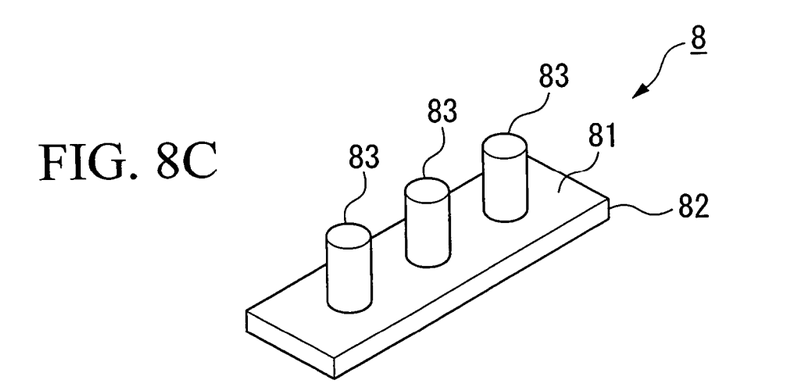

In the plug 8 in FIG. 8C, a plurality (three in this embodiment) of the protrusion parts 83 is formed on one base part 82, and the planar shape of the base part 82 is formed in a rectangular shape (it may also be formed in an elliptical or oval shape). According to such a construction, most of the magnetic flux from the magnet passes through the plug 8, and the magnetic attraction force between the magnet and the plug 8 can be improved.

Figure 8D:
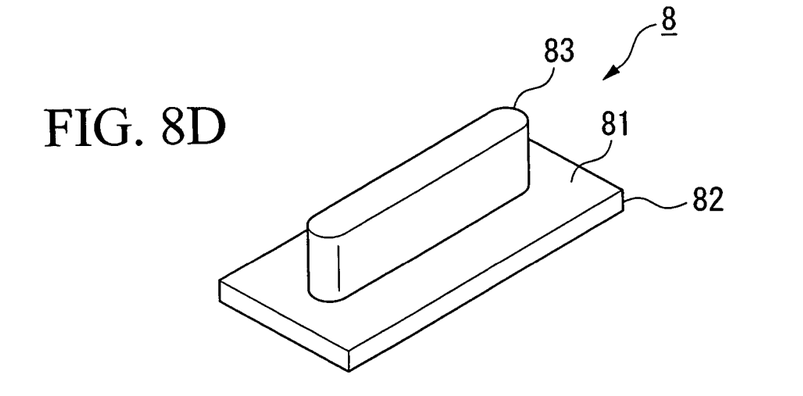

In the plug 8 in FIG. 8D, the planar shape of the protrusion part 83 is formed in an elliptical shape (or a rectangular shape). Moreover, the planar shape of the base part 82 is formed in a rectangular shape (it may also be formed in an elliptical or oval shape). According to such a construction also, most of the magnetic flux from the magnet passes through the plug 8, and the magnetic attraction force between the magnet and the plug 8 can be improved.

Next, as an example of an electro-optic device manufacturing method, a manufacturing method for an organic EL device is described.

Figure 9A:
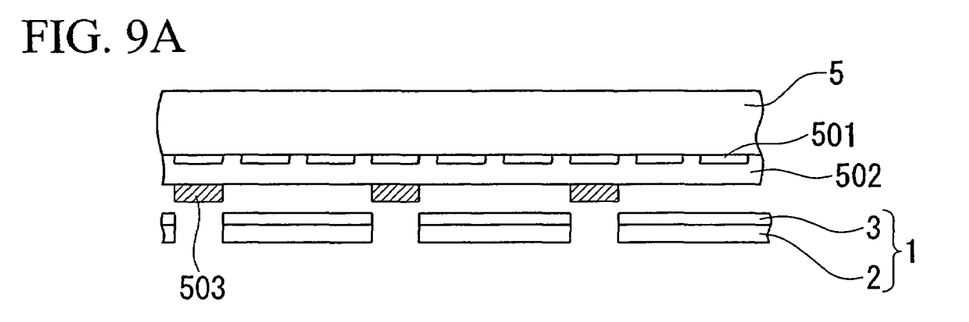
FIGS. 9A, 9B, and 9C are schematic sectional views showing one example of a manufacturing method of an electro-optic device.
Figure 9B:
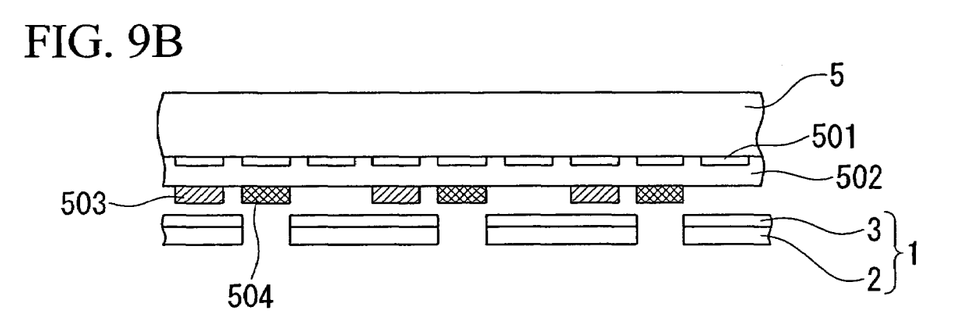
Figure 9C:
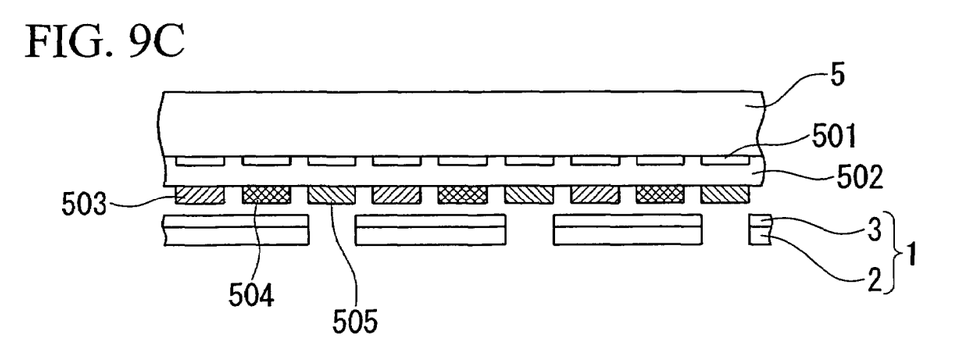

FIGS. 9A to 9C are schematic sectional views showing one example of a manufacturing method of an electro-optic device.

In this example, a film of luminescent material is formed on the deposition target substrate 5, using the mask 1. The luminescent material is for example an organic material. As a low molecular weight organic material, there is tris(8-hydroxyquinoline)aluminum ($Alq_3$), and as a high molecular organic material, there is polyparaphenylene vinylene (PPV). Vapor deposition enables a film of luminescent material to be formed. The substrate 5 is for forming a plurality of organic EL devices (organic EL elements), and is a transparent substrate such as a glass substrate. As shown in FIG. 9A, electrodes (for example transparent electrodes made from ITO or the like) 501 and a hole transport layer 502 are formed on the substrate 5. An electron transport layer may also be formed.

First, as shown in FIG. 9A, a red luminescent material is deposited on the substrate 5 through the mask 1, and a red luminescent layer 503 is formed. Subsequently, as shown in FIG. 9B, the mask 1 is displaced and a green luminescent material is deposited on the substrate 5, and a green luminescent layer 504 is formed. Then after that, as shown in FIG. 9C, the mask 1 is displaced again, and a blue luminescent material is deposited on the substrate 5, and a blue luminescent layer 505 is formed.

Here, in the mask shown in FIG. 1, a plurality of the aperture parts 20 are formed in the base plate 2, and the chips 3 are arranged in the respective aperture parts 20. By using such a mask 1, an organic EL device that corresponds to a large screen can be manufactured with a high level of accuracy.

In the case where vapor deposition is carried out for the organic luminescent layers 503, 504, and 505 using the mask 1 in which the chips 3 have been adhesively fixed to the base plate 2, the mask 1 and the substrate 5 make contact with each other several times in a vacuum chamber. Furthermore, in some cases, an object may physically make contact with the chip 3 in operations such as removal of organic film that has been attached to the chip 3 using $O_2$ plasma. For this reason, the chip 3 may become faulty or damaged in some cases. In the case where a fault or damage has occurred in some of the chips 3, repair of the damage is carried out by replacing the chips 3. By employing the mask 1 in which a plurality of the chips 3 are arranged on the base plate 2, only some of the chips 3 that have been damaged (faulty or damaged) need to be replaced with new chips, which is effective for reducing manufacturing cost.

Figure 10:
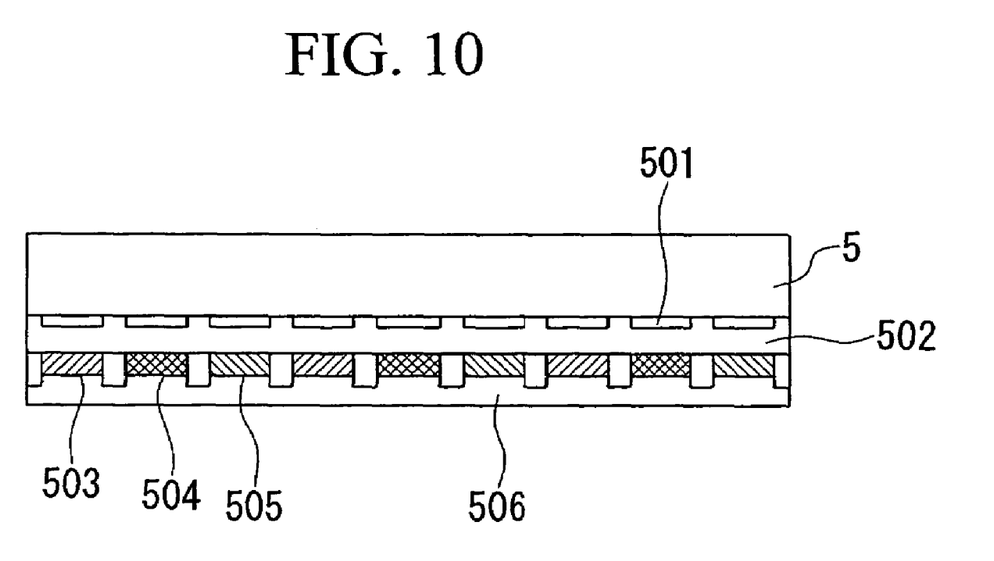
FIG. 10 is a schematic sectional view showing a schematic construction of an organic electroluminescence device manufactured by the abovementioned manufacturing method.

FIG. 10 is a schematic sectional view showing a schematic construction of an organic electroluminescence device manufactured by the abovementioned manufacturing method. The organic EL device has the substrate 5, the electrodes 501, the hole transport layer 502, the red luminescent layer 503, the green luminescent layer 504, and the blue luminescent layer 505. An electrode 506 is formed on the luminescent layers 503, 504 and 505. The electrode 506 is, for example, a cathode electrode. The organic EL device is preferably applied in a display device (display). By using the organic EL device in which pattern displacement of the luminescent layers 503, 504, and 505 is small, a display device of a large, uniform and vivid screen can be provided.

Figure 11:
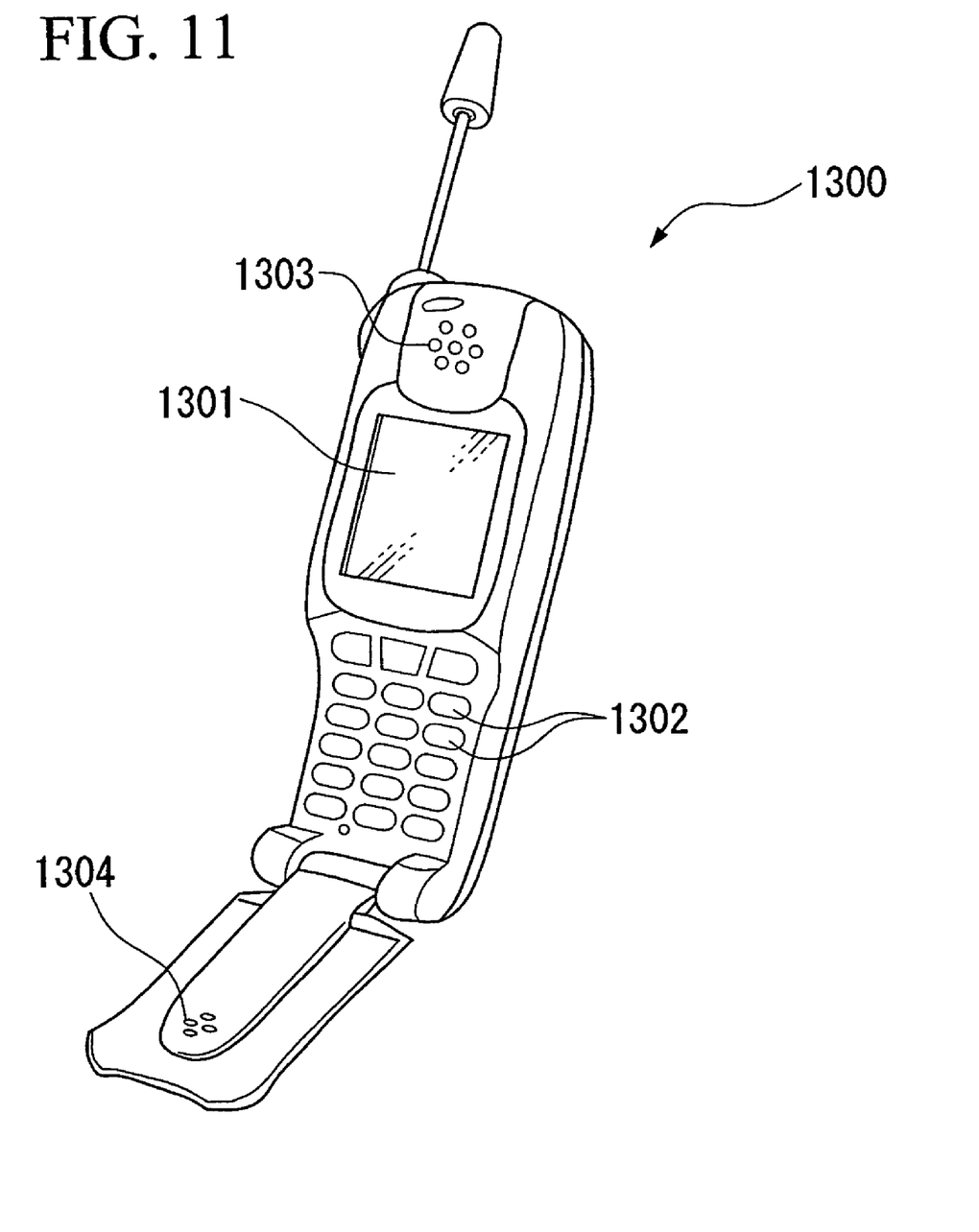
FIG. 11 is a perspective view showing an electronic apparatus according to the invention.

FIG. 11 is a perspective view showing an electronic apparatus.

A mobile phone 1300 shown in this diagram is provided with; a small sized display in which the above organic EL device is applied, a plurality of control buttons 1302, an ear piece 1303, and a mouth piece 1304.

The electro-optic device of the present invention is not limited to the above mobile phone, and can be applied to various kinds of electronic apparatus such as an electronic book, a personal computer, a digital still camera, a liquid crystal television, a view-finder type or monitor direct view type video tape recorder, a car navigation device, a pager, an electronic notebook, an electronic calculator, a word processor, a work station, a videophone, a POS terminal, and an apparatus that has a touch panel. Furthermore, in addition to an organic EL device, the electro-optic device of the present invention can preferably be applied in a liquid crystal device, a plasma display panel (PDP), a field emission display (FED) and the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A mask holding structure comprising:
  a bed plate having a bottom surface on which a substrate is disposed;
  magnets arranged at positions on the bed plate, end surfaces of the magnets being one of substantially flush with or inside the bottom surface of the bed plate;
  plugs respectively attracted to the magnets, end surfaces of the plugs being respectively adjacent to the end surfaces of the magnets; and
  a mask including a base plate and a silicon chip, the base plate having an opening and being made of glass, the silicon chip having an aperture pattern positioned at the opening of the base plate and being bonded onto the base plate by an adhesive agent;
  each of the plugs having a base part and a protrusion part, each base part having a contacting surface which makes contact with the base plate of the mask, each protrusion part projecting from the contacting surface and being inserted into one of a plurality of holes formed in the base plate, and
  magnetic attraction forces between the magnets and the plugs acting on the base plate via the contacting surfaces of the base parts of the plugs so that the mask in which the silicon chip has a top position is held by being pressed upward toward the bottom surface of the bed plate with the substrate therebetween.

2. A mask holding structure according to claim 1, wherein each of the magnets has a cylindrical shape that has an axis extending in a facing direction of the plugs and the magnets.

3. A mask holding structure according to claim 1, wherein each protrusion part has a diameter smaller than that of the magnets.

4. A mask holding structure according to claim 1, wherein each of the magnets is a rare-earth magnet.

5. A mask holding structure according to claim 1, wherein each of the plugs is made from a soft magnetic material.

6. A mask holding structure according to claim 1, wherein each of the plugs has a cylindrical shape that has an axis extending in a facing direction of the plugs and the magnets.

7. A mask holding structure according to claim 6, wherein each of the magnets has a cylindrical shape that has an axis extending in the facing direction of the plugs and the magnets, and each protrusion part has a diameter smaller than that of the magnets.

8. A mask holding structure according to claim 1, wherein the magnets comprise one of a samarium-cobalt magnet or a neodymium magnet.

* * * * *